United States Patent [19]

Kawamoto et al.

[11] Patent Number: 5,191,547
[45] Date of Patent: Mar. 2, 1993

[54] DECIMATING DIGITAL FINITE IMPULSE RESPONSE FILTER

[75] Inventors: Koji Kawamoto; Toru Kengaku; Eiichi Teraoka, all of Itami; Tetsuaki Oga; Hiroichi Ishida, both of Amagasaki, all of Japan

[73] Assignee: Mitsubishi Denki Kabushiki Kaisha, Tokyo, Japan

[21] Appl. No.: 564,808

[22] Filed: Aug. 8, 1990

[30] Foreign Application Priority Data

Aug. 18, 1989 [JP] Japan .................................. 1-213599

[51] Int. Cl.⁵ ............................................ G06F 15/31
[52] U.S. Cl. ................................................ 364/724.1
[58] Field of Search ...................... 364/724.10, 724.17, 364/724.01

[56] References Cited

U.S. PATENT DOCUMENTS

| 4,337,518 | 6/1982 | Ohnishi et al. | 364/724.17 |
| 4,521,866 | 6/1985 | Petit et al. | 364/724.1 |
| 4,561,065 | 12/1985 | Matsuda | 364/724.17 |
| 4,802,111 | 1/1989 | Barkan et al. | 364/724.1 |

FOREIGN PATENT DOCUMENTS

63-86915  4/1988  Japan .

Primary Examiner—Tan V. Mai
Attorney, Agent, or Firm—Townsend and Townsend

[57] ABSTRACT

A decimation type digital filter which utilizes the thinned-out signal of a finite impulse response (FIR) filter having N taps for processing the signal by the product sum operation of filter coefficients and the input signals inputted at every first period, in which, on the basis of the ratio K between a first period which is the input signal period and an output signal period and the number of taps N, M (a value obtained by raising below the decimal point of N/K) registers are provided and M successive output signals are processed by the product sum operation in parallel by respective registers, whereby the input signal is not necessarily to be held, a capacity of the register may be minimized and processing may be effected once for each register during the first period or by M number of times of product sum operation in total, thus the operating speed can be reduced to 1/K and the capacity and the operating speed can be optimized.

6 Claims, 12 Drawing Sheets

DECIMATING DIGITAL FINITE IMPULSE RESPONSE FILTER

BACKGROUND OF THE INVENTION

1. Field of the Invention

The present invention relates to a digital filter using an finite impulse response ("FIR") filter which processes signals by product sum operation, more particularly, it relates to a decimation type digital filter which operates at the input signal period t1 and output signal period t2 (t1<t2) to generate the M number of output signals (M=N·t1/t2) by the N number of input signals (N=1, 2, 3, ...).

2. Description of Related Art

Since a digital filter indicates the signal in digital values and processes it by a digital circuit, a good accuracy and stability can be obtained, thereby constituting a filter of characteristics which is difficult to be realized by an analog filter.

First, citing a direct FIR filter, hereinafter referred to as FIR (Finite Impulse Response) filter, called a transversal filter stated on Pages 113 to 118 in "Digital Signal Processing System, Digital Technology Series ③", issued by Tokai University Printing Association as an example, a conventional digital filter will be described with reference to the drawings.

Figure 1:
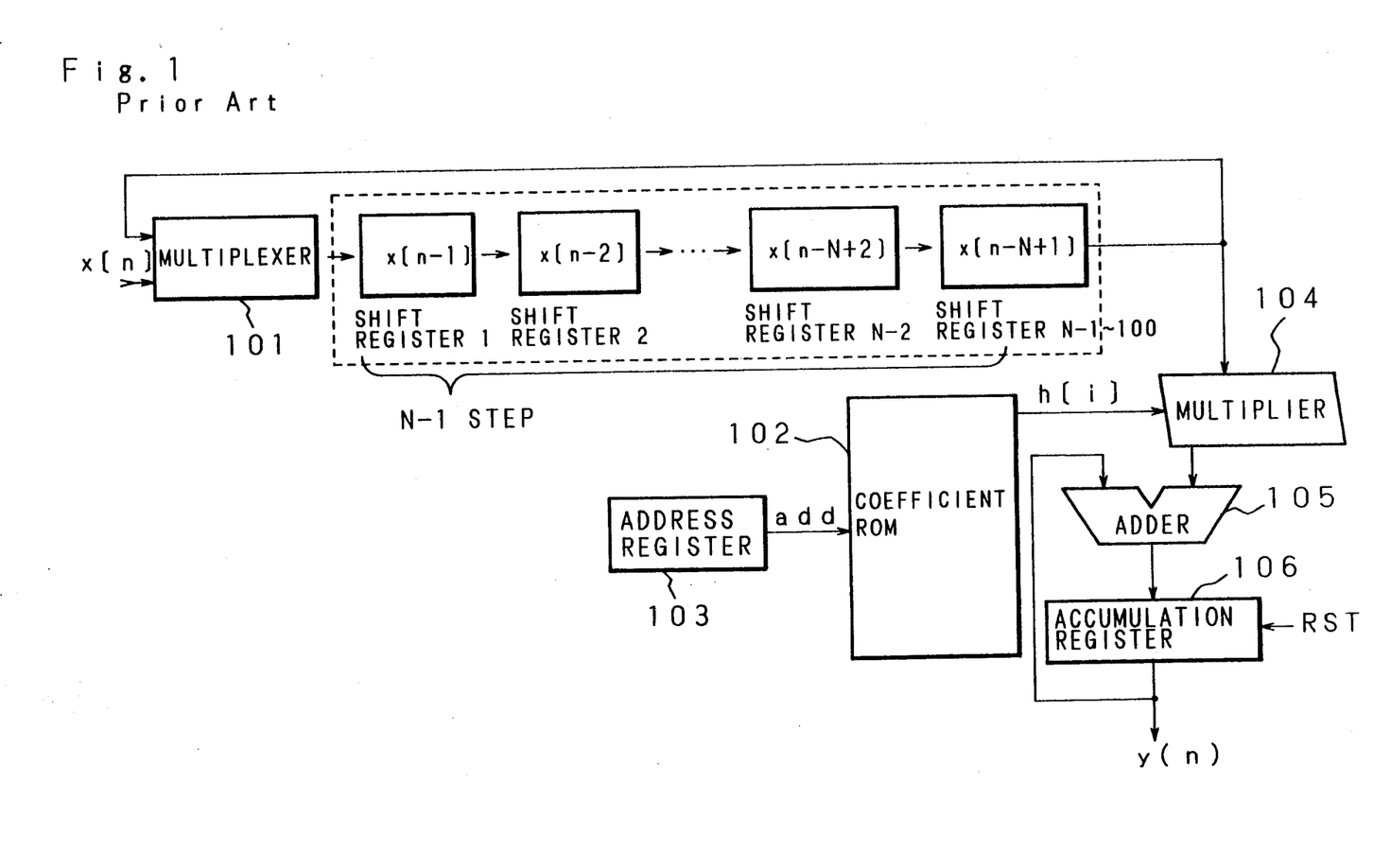
FIG. 1 is a block diagram showing the configuration of a conventional FIR filter.

The FIR filter described above will be first represented by a formula. The N-tap FIR filter is represented as $$y[n] = \sum_{i=0}^{N-1} h[i] \cdot x[n - i] \quad (1)$$

where, input signal $x[n]$, output signal $y[n]$ and filter coefficient $h[i]$ ($i=0$ to $N-1$). FIG. 1 is a block diagram based upon the figure shown on Page 117 of the aforesaid literature for the essential configuration by a 1-multiplier 1-adder type hardware of the FIR filter of the aforesaid formula. The conventional example will be explained with reference to the block diagram.

In the figure, the numeral 100 is an $N-1$ step shift registers for the input signal, and to the first step of which a multiplexer 101 is connected to select whether to make data to be inputted the input signal $x(n)$ or the data from the last step of the shift register 100.

The numeral 102 indicates an N-word-coefficient ROM for storing a filter coefficient $h[i]$ of the above formula (1), in which address ranges obtainable within 0 to $N-1$ correspond exactly to the obtainable ranges of an index $i$ of the filter coefficient $h[i]$.

The address add of the coefficient ROM 102 is designated by an address register 103 and the filter coefficient $h[i]$ stored in the designated address add is inputted to a multiplier 104, and multiplied by the input signal $x[n-i]$ from the utmost end of the shift register 100 therein.

Multiple result data $h[i] \cdot x[n-1]$ from the multiplier 104 is given to one end of an adder 105 and added to data of an accumulation register 106, in which it is stored again.

Figure 2:
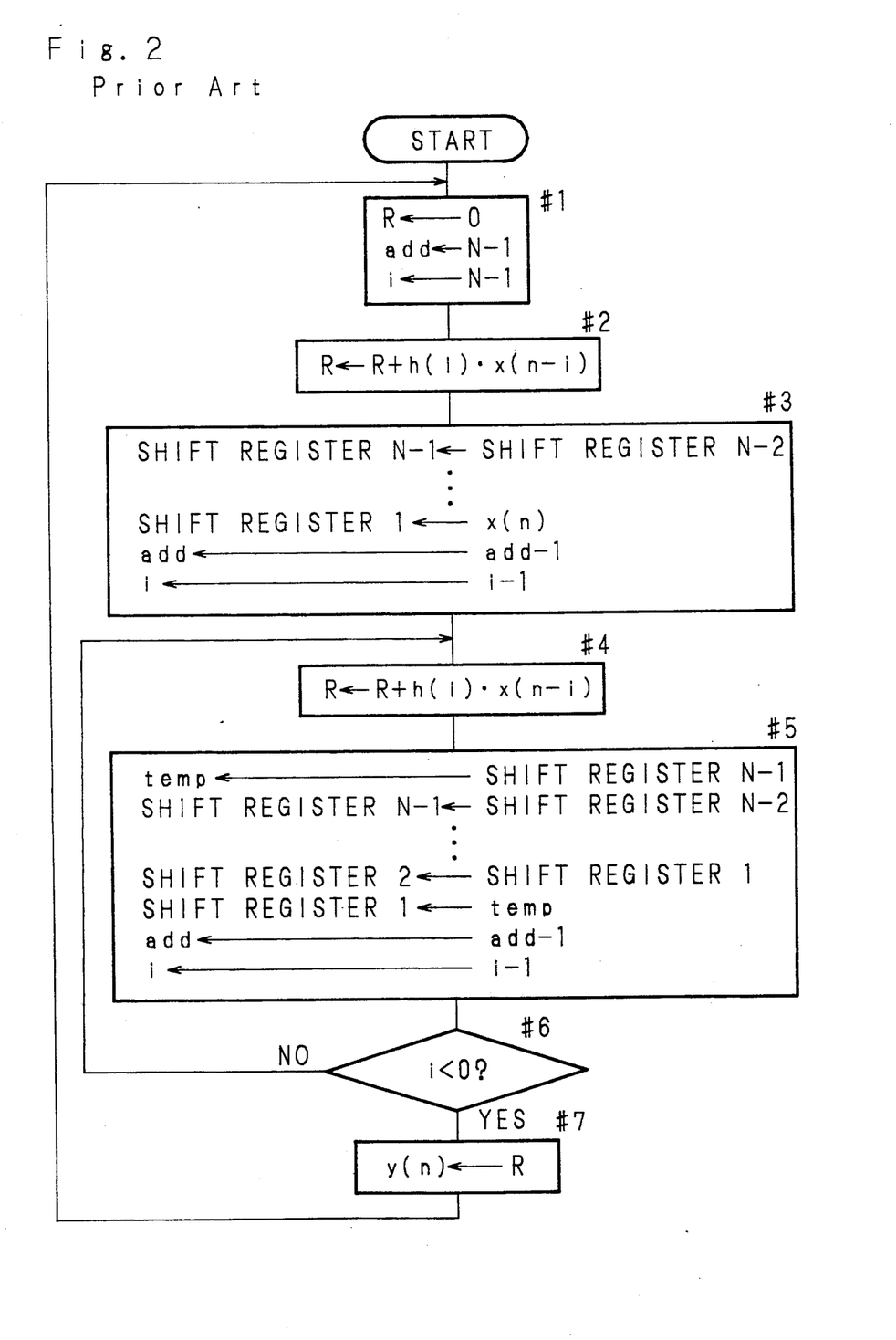
FIG. 2 is a flow chart showing the operation of a conventional FIR filter.

Next, the operation of the conventional FIR filter constructed as aforementioned will be described according to a flow chart shown in FIG. 2.

First, in Step #1, the accumulation register 106 is reset (R←0) by the reset signal RST, $N-1$ is written into the address register 103 of the coefficient ROM 102 (add ←$N-1$) and $N-1$ is substituted in a dummy variable i (i←$N-1$). Here, the dummy variable corresponds to a control register not shown.

Then, in Step #2, product sum operation is conducted by using the multiplier 104 and the adder 105 (R←R+h[i]·x[n−i], that is $$R = h[N - 1] \cdot x[n - (N - 1)] = \sum_{i=N-1}^{N-1} [i] \cdot x[n - i]).$$

In Step #3, the multiplexer 101 is controlled such that $x[n]$ is inputted to the shift register 100, whose content is shifted rightward by one step. Also, the address add and the dummy variable i are decremented (add←add−1, i←i−1).

Then, in Step #4, product sum operation is conducted by using the multiplier 104 and the adder 105 (R←R+[i]·x[n−i], that is $$R = \sum_{i=0}^{N-1} [i] \cdot x[n - i]$$

is obtained when the operation is repeated till i=0. After completing the product sum operation, in Step #5, the multiplexer 101 is controlled such that the right end output of the shift register 100 is inputted to its left end, and the content of the shift register 100 is shifted rightward by one step. The address add and the dummy variable i are also decremented (add←add−1, i←i−1). Then, in Step #6, it is determined whether the dummy variable i is smaller than zero. When it is zero or larger than zero, the procedure returns to Step #4 and when smaller than zero it proceeds to Step #7. That is, Steps #4, #5 are repeated until i becomes 0. When the product sum operation is finished, since the content of the accumulation register 106 is y[n] defined by the formula (1) in Step #7, it is outputted and the procedure returns to Step #1 for operation of the output signal y[n+1] of the next time point.

The FIR filtering is executed by the aforesaid operation.

Next, a decimation filter whose output signal is the thinned out output signal of the above FIR filter will be explained. The decimation filter is designed to thin out the output signal and used for realizing the filter such as a low-pass filter which eliminates the high frequency component. In the following, the conventional N-tap decimation filter which operates at the input signal period t1 and the output signal period t2 (t1<t2), generates the output signal by N number of input signals (N=1, 2, 3, ...) and outputs the output signal y[N] corresponding to data till the input signal x(N) during the period t2 will be explained as an example.

When applying to the operation of the aforesaid FIR filter, it may be operated in such a way that the output signal y[N] corresponding to the data till the input signal x[N] is outputted during the K (=t2/t1, K is an integer) number of input signals, and the output signal corresponding to data from the input signals x[n+1] to x[N+K−1] becomes y[N]. That is, it is same as thinning out the output signal corresponding to the data from the input signals x[n+1] to x[n+K−1].

Such a decimation filter may be expressed by the following formula. (T is an integer)

$$y[n = K \cdot T] = \sum_{i=0}^{N-1} h[i] \cdot x[n - i]$$

$$y[n = K \cdot T + m] = y[n = K \cdot T]$$
$$(1 \leq m < K; m \text{ is an integer})$$

Figure 3:
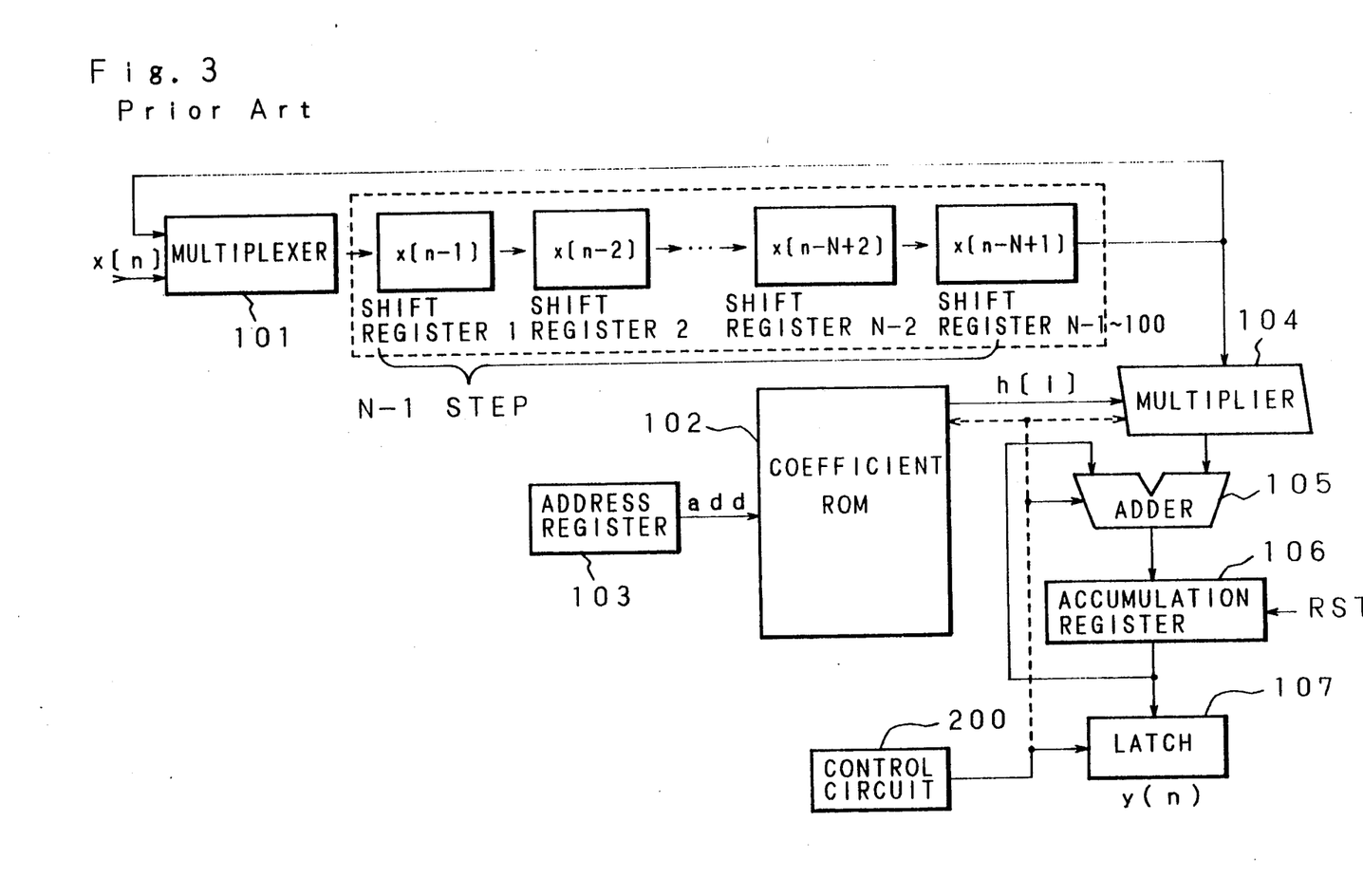
FIG. 3 is a block diagram showing essential portions of the configuration of a conventional decimation filter.

FIG. 3 is a block diagram showing the configuration of a conventional decimation filter using the FIR filter. In the figure, the numeral 200 designates a control circuit which controls whether or not to latch product sum operation results outputted from the adder 105 stored in the accumulation register 106 in a latch 107. When the data are processed at every K number as the aforesaid formula, the control circuit 200 controls such that the latch 107 latches the holding value of the accumulation register 106 after the K number of input signals are inputted to the shift register 100 after filtering once.

In the foregoing configuration of the decimation filter, irrespective of the output signal being thinned out, the product sum operation must be completed till sampling the next input signal, so that the product sum operation must be effected at the same operation speed as the FIR filter aforementioned. That is, the product sum operation must be conducted N times during one sampling period (=one input signal period).

Figure 11:
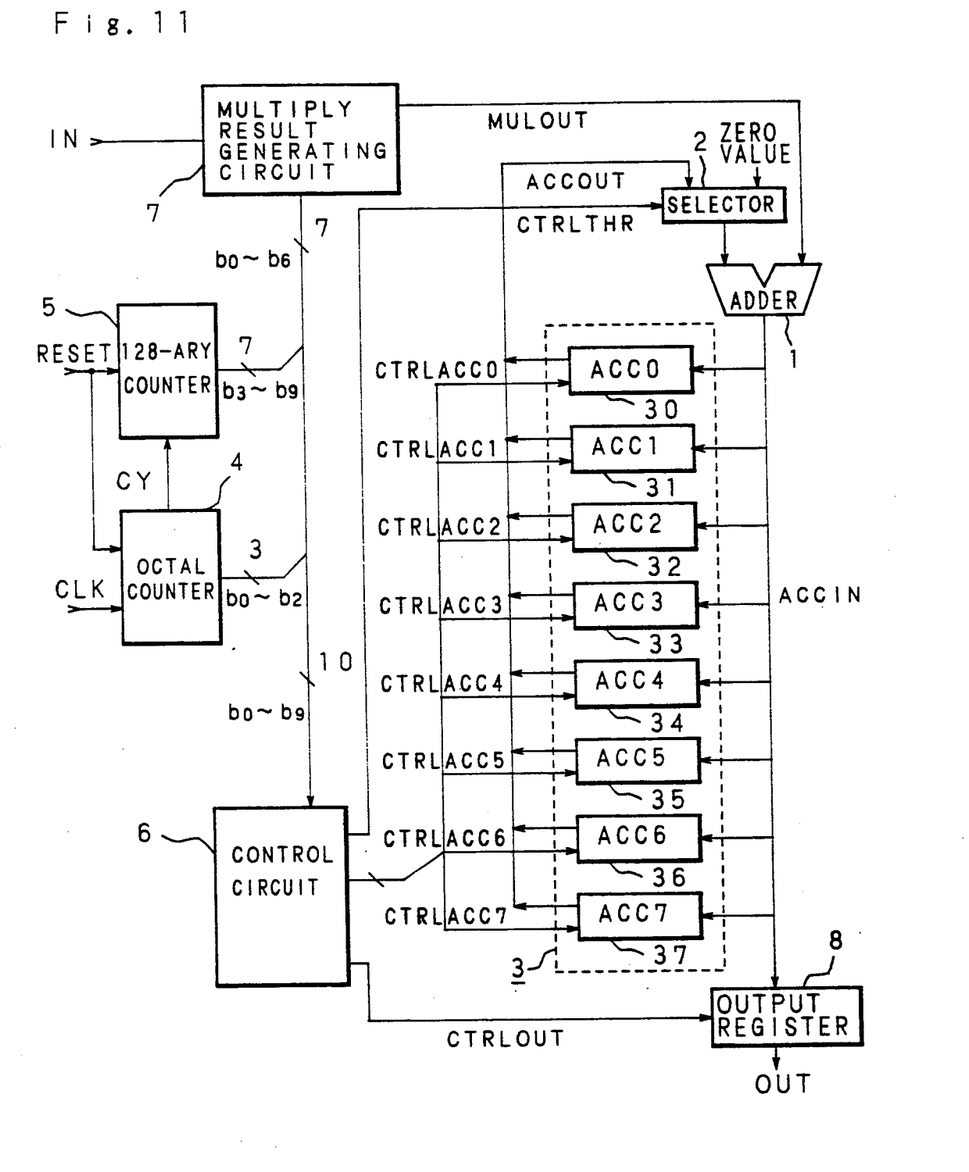
FIG. 11 is a block diagram showing the configuration of a decimation filter of still another embodiment.

Therefore, as shown by the broken line in FIG. 11, the control circuit 200 may be constructed to control the coefficient ROM 102, multiplier 104 and adder 105 by its control signal in the same way as the latch 107 and control such that the coefficient ROM 102, multiplier 104, adder 105 and latch 107 operate only when generating the output signal and not operate while the output signal is thinned out.

Also in this case, however, since the product sum operation necessary for the filtering must be effected during the input signal period t1 between one input signal and the next input signal in the decimation filter, the operating speed of the product sum operation is same as that when the output signal is not thinned out, thus elements such as a multiplier and an adder which operate at the same speed are required. Also, in the hardware side, since each of the input signals must be held during the output signal period t2, a shift register having taps of N−1 steps is required.

As an example, the configuration and operating speed of a decimation filter having the number of taps N=128 and output signal period/input signal period =K=t2/t1 will be considered. In the above configuration, a shift register of 127 steps is needed as a hardware and the operating speed of input signal period t1×128 is required in the coefficient ROM 102, multiplier 104, adder 105 and accumulation register 106 as the operating speed.

As such, in the conventional digital filter, even when the output signal period is longer than the input signal period, since the shift register is used as storing means to hold respective input signals during the output signal period, the storing means having the same capacity as the digital filter in which two periods are same is needed, thus such a problem is encountered that the construction of the hardware becomes complicated and its capacity can not be optimized.

Likewise, since filtering for the output signal or the product sum operation by the number of taps must be effected in the input signal period t1 of one data, a high speed arithmetic unit is required, thus a filtering circuit is difficult to design and power consumption becomes higher.

SUMMARY OF THE INVENTION

The present invention has been devised in view of such circumstances, therefore, it is a primary object thereof to provide a digital filter, in which a capacity of storing means necessary for decimation filtering wherein the output signal period is larger than the input signal period can be optimized. It is another object of the present invention to provide a digital filter, in which arithmetic units such as a low speed multiplier and adder can be used by slowing the operation speed by effecting the product sum operation necessary for the filtering evenly as possible within the output signal period, a filtering circuit can be designed simply and power consumption can be minimized.

First, referring to FIGS. 6(a) through (i) showing the schematic operation of the invention, the principle of optimization of the number of registers of a decimation filter which is the digital filter according to the invention will be explained.

Figure 6:
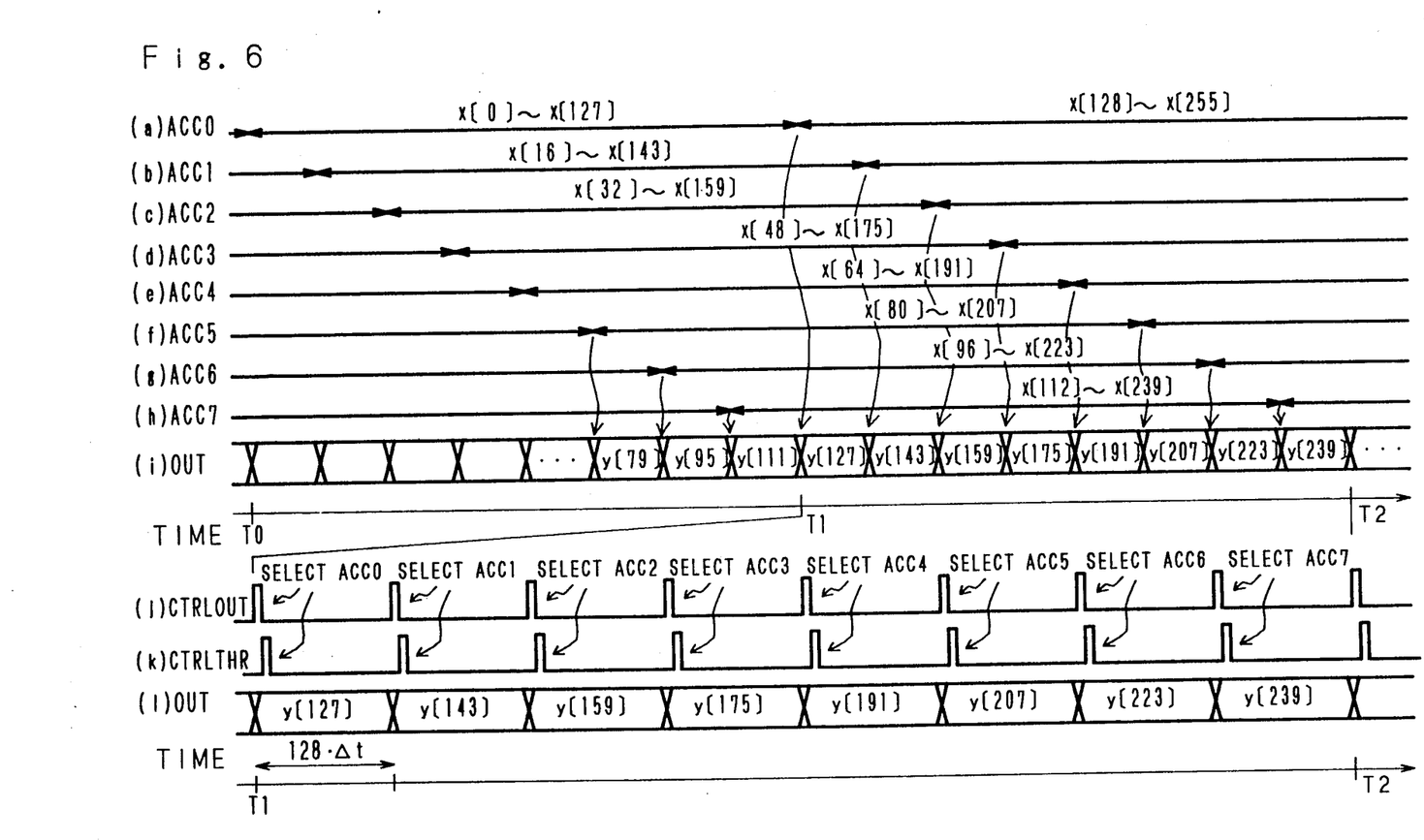

For the purpose of simplification of the explanation, a decimation filter having the number of taps N=128 and K=16 will be described. Here, the operation of the decimation filter will be described using an input signal row (x[0], x[1], x[2]...) after the time t0 for the sake of explanation.

First, the output signal is created by using the continuous input signals by the number of taps (=128) in the same way as the conventional FIR filter. (For example, as shown in FIGS. 6(a) and (i), the output signal y[127] is created from the input signals x[0] to x[127]).

Then, the output signal is outputted at every 16 input periods of the input signals since output signal period/input signal period K=t2/t1=16. For instance, as shown in FIGS. 6(b) through (i), the next output signal of the output signal y[127] becomes y[143] using the 128 input signal rows x[16] to x[143] from x[16] to x[127+16]. Similarly, the output signal thereafter becomes y[159] using x[32] to x[159], y[175] using x[48] to x[175] and y[191] using x[64] to x[191].

Now, optimization of the decimation filter thus constructed will be considered.

Here, the common input signals used for the output signals y[127] and y[143] are 128−16=112, 112−16=96 for y[127] and y[159] and 96−16=80 for y[127] and y[175], thus there are 128−M·16 common input signals for the output signal separated by M number of output periods. That is, there is no input signal used commonly between the output signals separated over M=8 output periods. Thereafter, when eight successive output signals are processed in parallel for one input signal, the input signal is not necessary to be held. That is, the input signal is not needed to be held by providing eight registers corresponding to the output signal. Also, the product sum operation may be effected once in the input signal period t1 for each register or in other words eight times all together, thus the product sum operation performed by the number of taps N (=128) in the past may be effected eight times and its operating speed may be 1/16.

Generalizing the above, by arranging the number of M registers for the output signals represented by M=N·t1/t2 and outputted in series, the input signal is not necessary to be held. That is, the number of registers may be reduced thereby for optimization. Also, the product sum operation may be effected M times during the input signal period t1 and an arithmetic unit having the operating speed of 1/K can be used.

The above and further objects and features of the invention will more fully be apparent from the following detailed description with accompanying drawings.

BRIEF DESCRIPTION OF THE DRAWINGS

FIGS. 6 through 8 are timing charts showing the operation, FIGS. 9(a), (b) are block diagrams showing exemplary configurations of a multiple result generating circuit.

DESCRIPTION OF THE PREFERRED EMBODIMENTS

In the following, the present invention will be described with reference to the drawings showing the embodiments.

Figure 4:
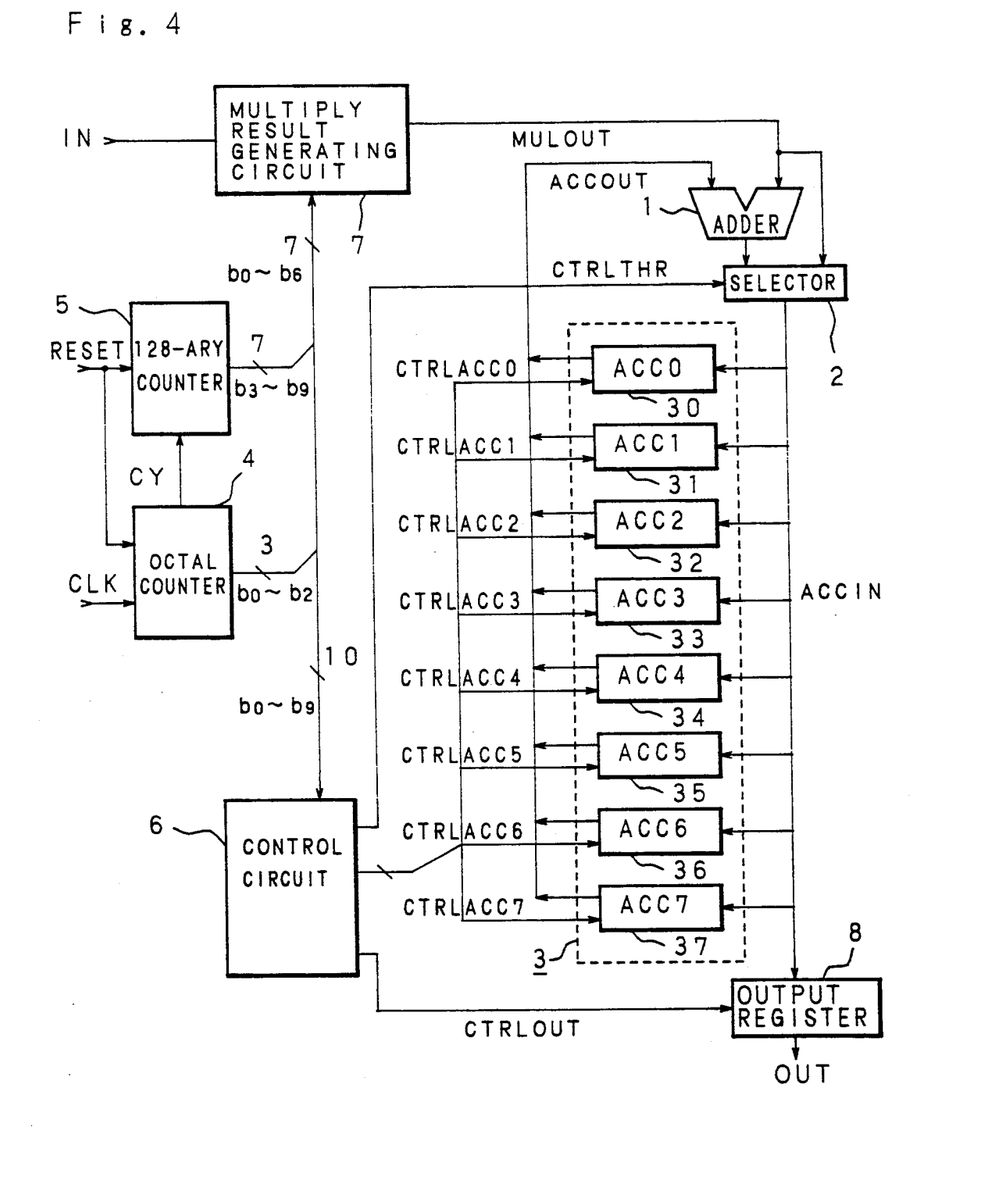
FIG. 4 is a block diagram showing the configuration of a decimation filter which is a digital filter according to the invention.

In FIG. 4, the numeral 7 denotes a multiply result generating circuit which multiplies the input signal IN inputted at a predetermined sampling period t1 by a filter coefficient and outputs it. Multiply result data MULOUT is given to one input terminal of an adder 1 as well as to one input terminal of a selector 2. To the other input terminal of the adder 1, intermediate filtering data ACCOUT stored in either of eight registers ACC0 30 to ACC7 37 to be described later are given and added to output filtering product sum operation result data ADDOUT. The product sum operation result data ADDOUT are given to the other input terminal of the selector 2, which selects and outputs the product sum operation result data ADDOUT or multiple result data MULOUT. The selected output data ACCIN are given to either of the registers ACC0 30 to ACC7 37 in a register group 3 consisting of 8 registers 30 to 37 as well as to an output register 8 and held therein respectively. Operations of the selector 2, register group 3 and output register 8 are controlled by respective control signals from the control circuit. The selector 2 is controlled by the selector control signal CTRLTHR from the control circuit 6 and each of the registers ACC0 30 to ACC7 37 of the register group 3 is controlled the operations to store the output data ACCIN from the selector 2, and the operation to output the content of the registers ACC0 30 to ACC7 37 to the adder 1 as the intermediate data ACCOUT by the register control signals CTRLACC0 to CTRLACC7.

Also, to the multiple result generating circuit 7 and the control circuit 6, counter signals b0 to b2 and counter signals b3 to b9 are given separately from a binary coded octal counter (hereinafter referred to as an octal counter) 4 being first counting means which outputs 3-bit width counter signals b0 to b2, and a binary coded 128-ary counter (hereinafter referred to as a 128-ary counter) 5 being second counting means which outputs 7-bit width counter signals b3 to b9. The octal counter 4 operates to count by the timing signal CLK having a period $\Delta t$ ($=t1/M$) of input signal period $t1$/number of registers M from external circuits not shown, and is initialized by the reset signal RESET.

The carry signal CY of the octal counter 4 becomes the input clock signal to the 128-ary counter 5. The 128-ary counter 5 is designed to output the 7-bit width counter signals b3 to b9 and 4-bit width counter signals b3 to b6 respectively to the control circuit 6 and the multiple result generating circuit 7, operates to count by the carry signal CY from the octal counter 4 and is initialized by the reset signal RESET.

The control circuit 6 is controlled by the counter signals b0 to b9 from the octal counter 4 and the 128-ary counter 5 to control, as previously described, the operation of the selector 2, the register group 3 in which intermediate filtering data are held and the output register 8.

The output register 8 is designed to hold the last filtering data to output to external circuits not shown, the holding operation is controlled by the control signal CTRLOUT from the control circuit 6 and the data held is outputted intact to the external circuit as the output signal OUT.

Figure 5:
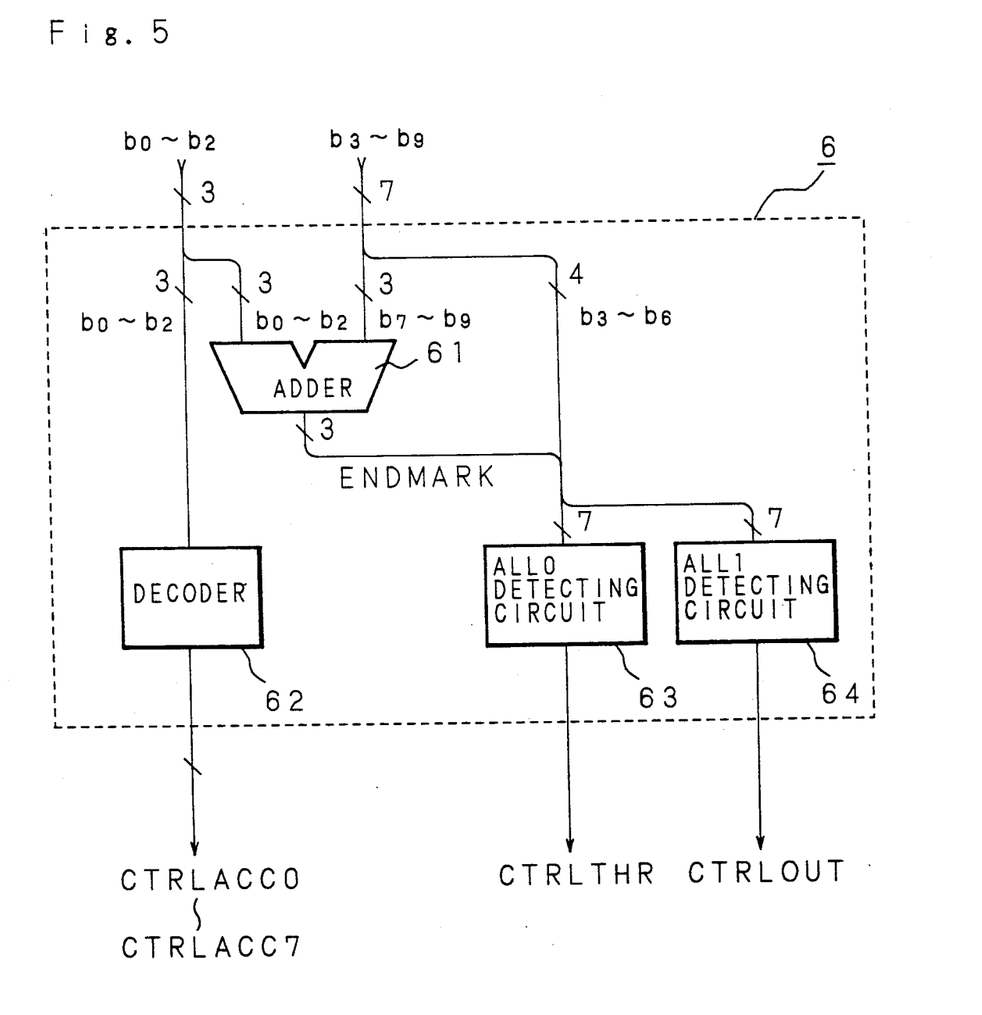
FIG. 5 is a block diagram showing the configuration of a control circuit.

Now, before explaining the operation of the decimation filter of the invention shown in FIG. 4, an exemplary configuration of the control circuit 6 will be described in detail. FIG. 5 is a block diagram showing the configuration of the control circuit.

In the figure, the numeral 61 indicates an adder which outputs 3 bits of the added result of counter signals b0 to b2 from the octal counter 4 and counter signals b7 to b9 of the lower 3 bits from the 128-ary counter 5 respectively as a 3-bit width numeral value as the end check signal ENDMARK. The counter signals b0 to b2 from the octal counter 4 are given to a decoder 62 so as to be decoded therein and 8 kinds of control signals CTRLACC0 to CTRLACC7 are outputted. The decoder 62 respectively activates the control signal CTRLACC7 when the counter signals b0 to b2 are 0, the control signal CTRLACC6 when 1, the control signal CTRLACC5 when 2, the control signal CTRLACC4 when 3, the control signal CTRLACC3 when 4, the control signal CTRLACC2 when 5, the control signal CTRLACC1 when 6 and the control signal CTRLACC0 when 7.

The end check signal ENDMARK from the adder 61 and the upper 4-bit width counter signals b3 to b6 from end the 128-ary counter 5 are given respectively to ALL0 to ALL1 detecting circuits 62, 63, whereby the control signal CTRLTHR is activated when the counter signals b3 to b6 are entirely "0" in the ALL0 detecting circuit 62, and the control signal CTRLOUT is activated when they are entirely "1" in the ALL1 detecting circuit 63.

Incidentally, the end check signal ENDMARK for respective registers is incremented by 1 and assumes a value from 0 to 7 (returns to 0 after 7) whenever the counter signals b7 to b9 are incremented by 1. That is, since the timing of the control signals CTRLOUT, CTRLTHR to become active is quickened by $\Delta t$ at every 128·$\Delta t$, the register corresponding thereto changes successively from ACC0 30 to ACC7 37 (returns to the register ACC0 after the register ACC7). That is, the final result is outputted at every 16 input signals (=16·8·Δt=128Δt) and the registers being initialized are changed over successively.

Figure 7:
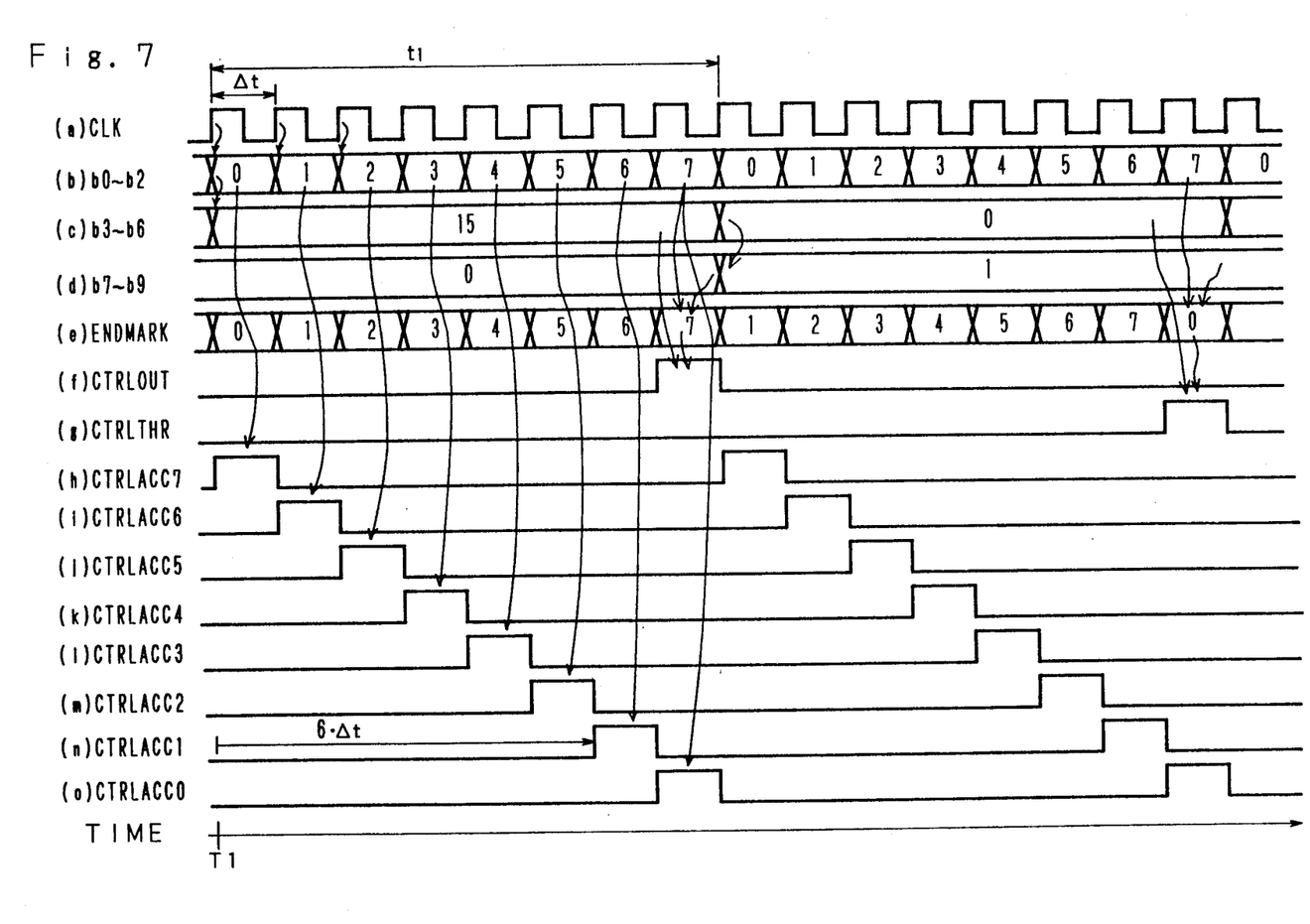
Figure 8:
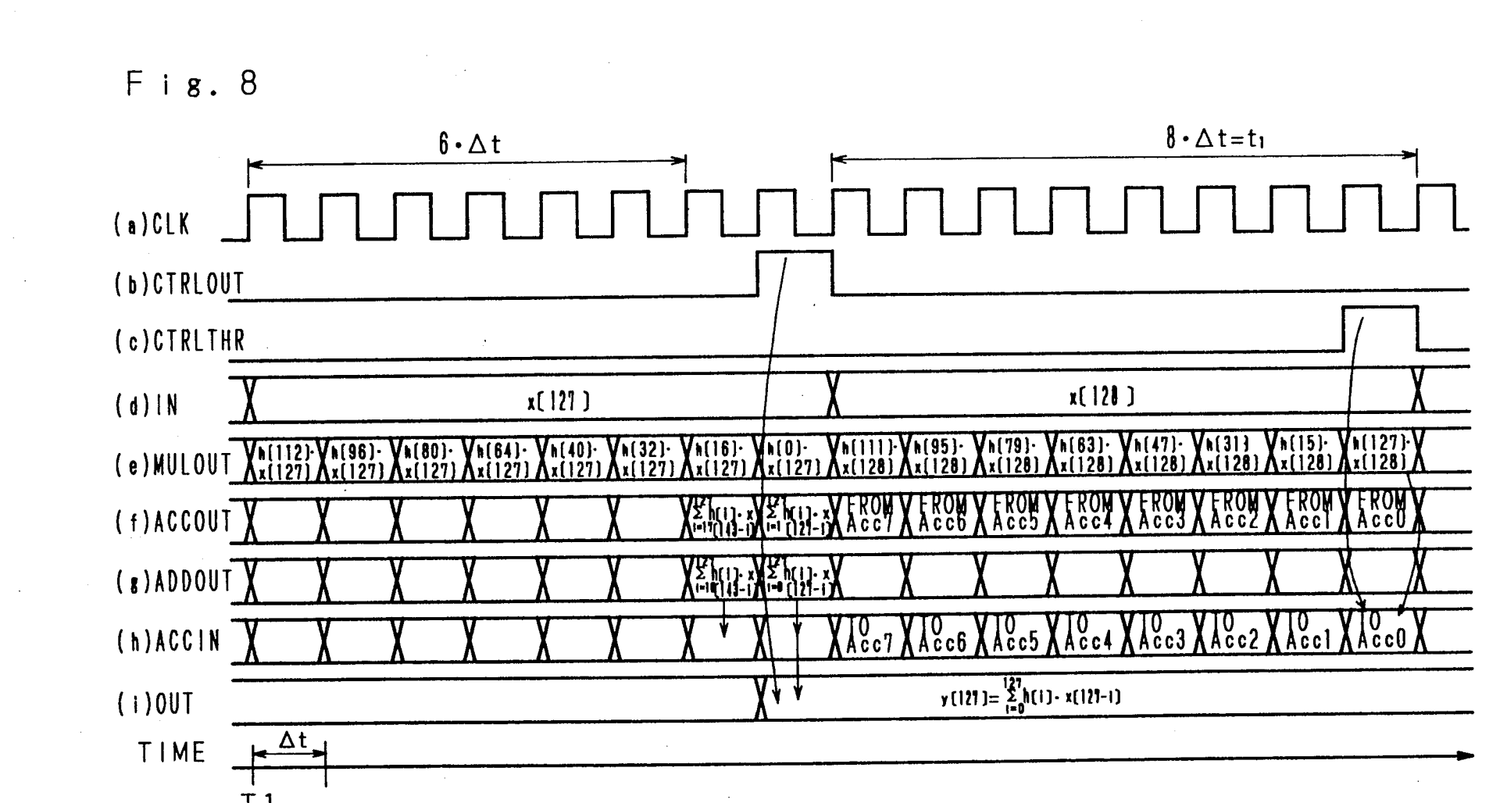

Next, the operation of the decimation filter of the invention will be described as a whole. FIG. 6 is a timing chart of the entire operation, FIG. 7 is a timing chart of a control circuit and FIG. 8 is a timing chart showing a data flow. First, the detailed timing of the control signal centering around the control circuit 6 will be explained with reference to FIG. 7. In the figure, timing charts of the timing signal CLK, counter signals b0 to b2, b3 to b6, b7 to b9, end check signal ENDMARK and control signals CTRLOUT, CTRLTHR, CTRLACC7, CTRLACC6, CTRLACC5, CTRLACC4, CTRLACC3, CTRLACC2, CTRLACC1, CTRLACC0 are shown. The time range is between about 16 times of the timing signal CLK 1 period (Δt) of the time T1 to T1+16·Δt.

In the figure, by the timing signal CLK, the octal counter 4 repeatedly outputs the counter signals from 0 to 7, and the 128-ary counter 5 repeatedly outputs the counter signals from 0 to 127 by the carry signal CY at returning of the value from 7 to 0. In FIGS. 7(c), (d), the counter signals b3 to b9 are shown separately by the lower 4-bit b3 to b6 and the upper 3-bit b7 to b9 respectively as the 4-bit and 3-bit width numerical values.

First, according to the value of counter signals b0 to b2, the control signals CTRLACC7 to CTRLACC0 are selected successively and activated as described above.

Also, when the end check signal ENDMARK becomes 7 during the 8·Δt time interval in which the counter signals b3 to b6 are 15, the control signal CTRLOUT is activated by the ALL1 detecting circuit 64. Then, at this time, the filtered result ACCIN obtained by using the register ACC0 30 selected by one (CTRLACC0 in the figure) of the control signals CTRLACC7 to CTRLACC0 which are generated simultaneously for selecting one register out from the register group 3, is held intact in the output register 8 and outputted to the external circuit as the output signal OUT.

Thereafter, when the end check signal ENDMARK becomes 0 during the 8·Δt time interval in which the counter signals b3 to b6 are 0, the control signal CTRLTHR is activated by the ALL0 detecting circuit 63. Then, at this time, to the register ACC0 30 selected by one (CTRLACC0 in the figure) of the control signals CTRLACC7 to CTRLACC0 which are generated simultaneously for selecting one register out from the register group 3, the multiply result data MULOUT from the multiply result generating circuit 7 is inputted intact and initialized to start a new filtering.

Next, centering around a data flow, description will be made in detail with reference to FIG. 8. In the figure, in the same time range as FIG. 7, timing charts of the timing signal CLK, control signals CTRLOUT, CTRLTHR, input signal IN, multiple result data MULOUT, intermediate data ACCOUT from the register group 3, product sum operation result signal ADDOUT, selector output data ACCIN and output signal OUT are shown. The time range is the time T1 to T1+16·Δt.

In the figure, at time T1+6·Δt the control signal CTRLACC1 becomes active (refer to FIG. 7) and the register ACC1 31 is selected as the register. At this time, the multiply result data MULOUT=h[16]·x[127] with the filter coefficient selected according to the input signal IN and the timing signal CLK is outputted from the multiple result generating circuit 7. Then, as the control signal CTRLTHR is not active, the intermediate data $$ACCOUT = \sum_{i=17}^{127} h[i] \cdot x[143 - i]$$

from the register ACC1 31 shown in FIG. 8(f) and the multiply result data MULOUT are added in the adder 1, and the result $$ADDOUT = \sum_{i=16}^{127} h[i] \cdot x[143 - i]$$

is returned to the register ACC1 31, whereby the product sum operation for one tap filtering is completed. In such a manner, during the period of T1 to T1+8·Δt, in the registers ACC7 to ACC0, the product sum operation for one tap filtering for the eight output signals using one input signal x[127] is effected. Similarly, during the period of T1+8·Δt to T1+16·Δt, in the registers ACC7 to ACC0, the filtering using the next input signal x[128] is effected.

When the 128 tap product sum operation is completed in such a manner and the filtering for one output signal is finished, the control circuit 6 activates the control signal to the register wherein the last product sum operation is conducted as well as the control signal to the output register 8. At time T1+7·Δt in the figure, the filtering using the register ACC0 30 is completed and the output signal $$ADDOUT = \sum_{i=0}^{127} h[i] \cdot x[127 - i]$$

which is the end product sum operation result is stored in the register ACC0 30 as well as in the output register 8 by the control signal CTRLOUT from the control circuit 6, and outputted to the external circuits as the output signal OUT (=y[127]). Thereafter, the register ACC0 30 which has finished outputting the filtering result is selected by the control signal CTRLACC0 at time T1+16·Δt at which the next input signal IN (=x[128]) is held, and the multiply result data MULOUT (=h[127]·x[128]) from the multiply result generating circuit 7 is stored intact by the control signal CTRLTHR and initialized. That is, filtering for the new output signal is started in the register ACC0 30.

Next, the operation of the register which holds intermediate data will be explained with reference to FIGS. 6(j) through (l). In the figure, timing charts of the control signals CTRLOUT, CTRLTHR and the output signal OUT are shown. The time range is time T1 to T1+8·128·Δt.

The product sum operation result y[127] of filtering using the register ACC0 30 at time T1 is outputted as the output signal, and in the register ACC0 30 the filtering for the new output signal y[255] is started from the next input signal. The register ACC1 31 outputs signal data y[143] which has been filtered hitherto to the output register 8 as the output signal OUT according to the control signals CTRLACC0 to CTRLACC7, CTRLOUT after 16·8·Δt from the time T1 during which 16 data have been inputted. Similarly, in the register ACC1 31 the filtering for the new output signal is started from the next input signal. The next output signal y[159] is outputted from the register ACC2 32 further after 16·8·Δt. In such a manner the eight registers ACC0 30 to ACC7 37 are used successively in circulation.

Now, the timing of the input and output signals will be explained with reference to FIGS. 6(a) through (i). In the figure, timing charts of the content of the input signals processed by the registers ACC0 30~ACC7 37 and the output signals OUT for the input signal IN in FIG. 4 are shown. The time range is time T0 (=T1−128·8·Δt) to T2 (=T1+128·8·Δt).

A signal row x[0], x[1], ... x[127] inputted after the time T0 is taken successively into the multiple result generating circuit 7, and at time T1 (=T0+8·128·Δt) when 128 data input is completed, the output signal y[127] obtained by filtering the input signals x[0] to x[127] using the register ACC0 30 is outputted. At time T1+16·8·Δt, the output signal y[143] obtained by filtering the input signals x[16] to x[143] using the register ACC1 31 is outputted. By using the 8 registers ACC0 30~ACC7 37 successively in circulation in such a way, the product sum operation necessary for filtering is effected equally and any useless operation can be avoided. Also, an extra storing circuit for keeping the input signal used while filtering the eight output signals is not necessary.

Now, the configuration and operating speed of, for example, a decimation filter (output signal period/input signal period=K=t2/t1=16) having the number of taps N=128 will be considered. In the conventional configuration, a 127-step shift register is needed and the operating speed of 1/input signal period X128 is necessary in the coefficient ROM, multiplier, adder and accumulation register. In the invention, however, the operation is possible by eight registers in place of the 127-step shift register and the coefficient ROM, multiplier, adder and register can be operated at the operating speed of 1/input signal period ×8.

In the aforesaid embodiment, since K=16 and N=128, M=N/K=8=$2^3$, thus the octal counter 4 can be constituted simply by a binary counter. However, when N=96, M=96/16=6, thus a hexal counter is needed. When the hexal counter is realized by the binary counter, the count value must be decoded to generate the carry signal. Therefore, in such a case, using a binary octal counter $2^I$-ary counter ($2^{I-1} < M \leq 2^I$, I is an integer) may be utilized by eliminating the registers ACC7 37, ACC6 36 without using, for example, control signals CTRLACC7, CTRLACC6 corresponding to count values 0, 1. Since the $2^I$-ary counter (I is an integer) can be generally realized easily in a digital circuit, the circuit may be simplified.

Figure 9A:
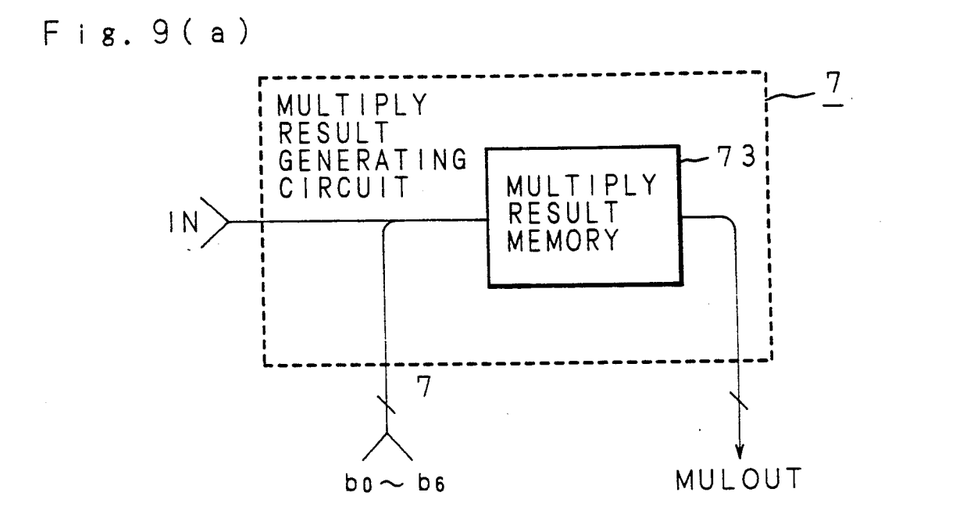

The multiply result generating circuit 7 can be realized by the configuration as shown in the following. FIG. 9 is a block diagram showing the configuration of a multiply result generating circuit. First, in FIG. 9(a), the numeral 73 denotes a multiply result memory using the memory such as a ROM or RAM in which multiply results of the filter coefficient and input signal IN are stored in advance, whereby multiply result data MULOUT stored in the address generated on the basis of the count data b0 to b2 from the octal counter 4, 4-bit width count data b3 to b6 from the 128-ary counter 5 and the input signals is outputted (data of assumable number of input signal ×128 words are arranged). For example, when the input signal IN is 4 bits (16 levels), the address data of 16×128=2048 words are arranged.

Figure 9B:
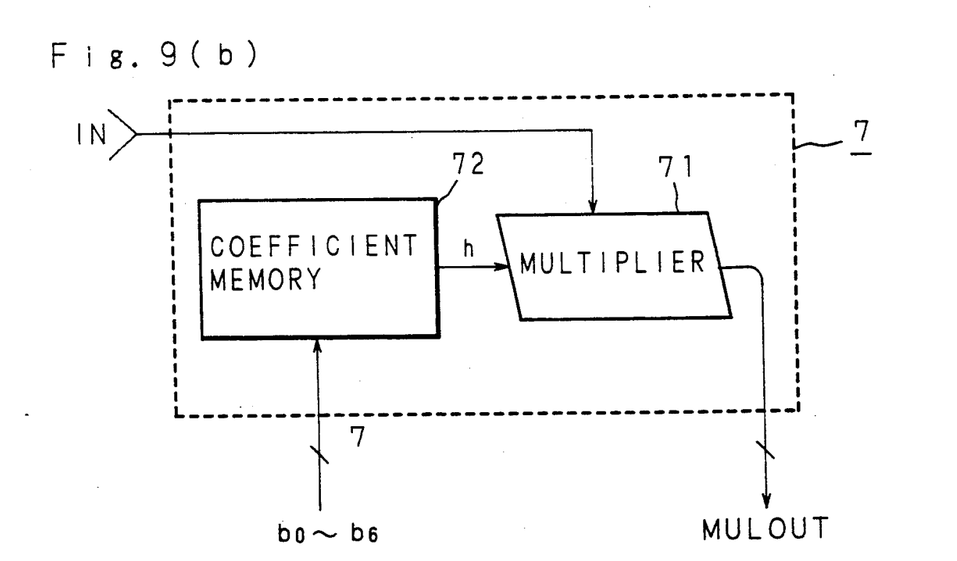

Also, the multiply result generating circuit 7 may be constituted by a coefficient memory and a multiplier. In FIG. 9(b), the numeral 71 indicates a multiplier, which multiplies the input signal IN by the filter coefficient h from the storing circuit 72 to output the multiply result data MULOUT.

Numeral 72 designates a coefficient memory using such as a ROM and RAM storing filter coefficients, whereby the coefficient is selected by count data b0 to b2 from the octal counter 4 and 4-bit width count data b3 to b6 from the 128-ary counter 5 altogether by 7-bit width address signals (128 address).

Incidentally, the filter coefficients stored in the coefficient memory 72 are, as shown in FIG. 8(e), stored such that h[111], h[95], ... h[127], h[110], h[94], ... h[112]. . . h[0] are stored respectively in addresses 0, 1, ... 7, 8, 9 ... 120, ... 127. Also in the multiple result memory 73, the filter coefficients h[i] are stored for each input signal level in the same order.

Figure 10:
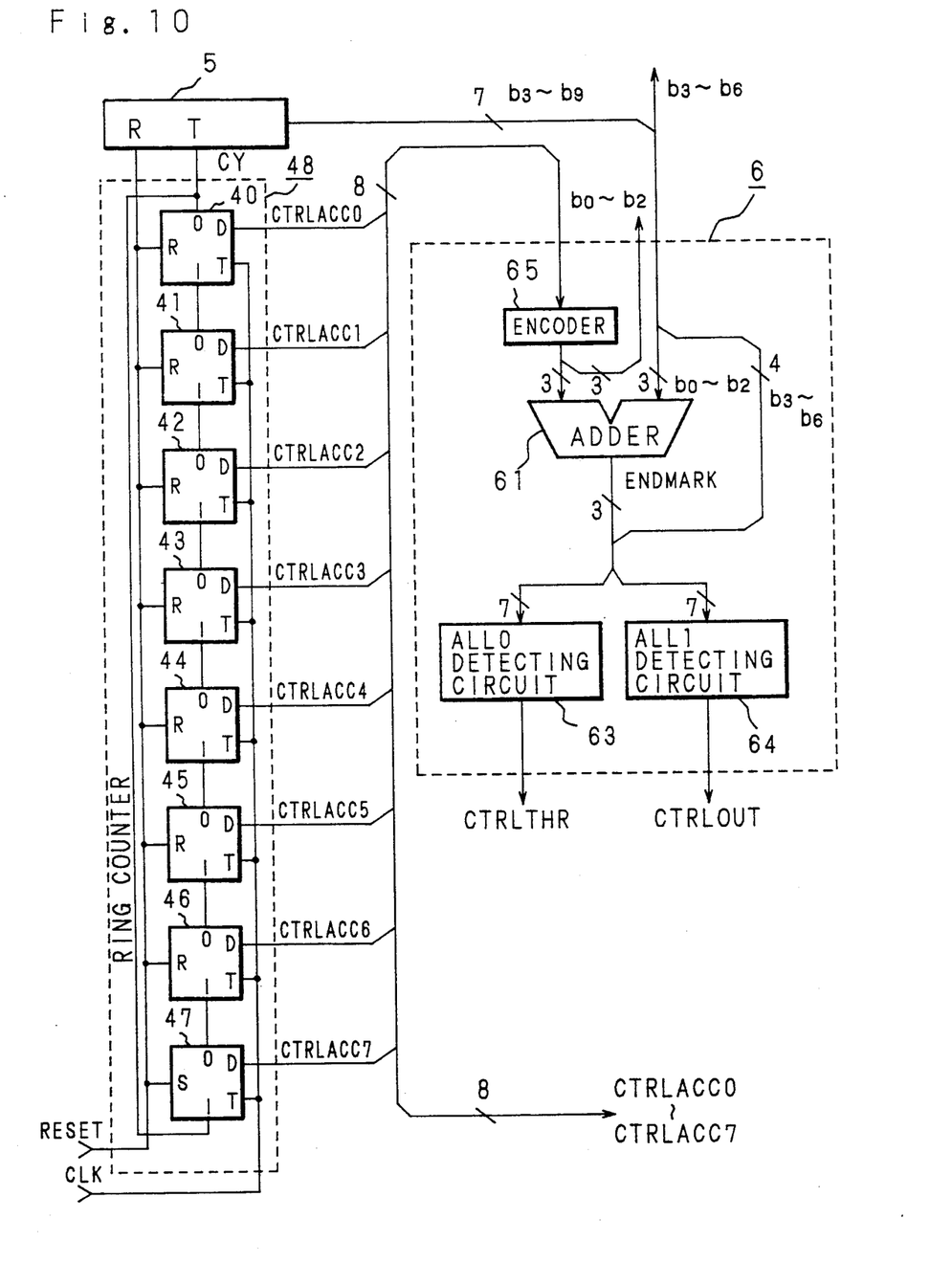
FIG. 10 is a block diagram showing the configuration of a decimation filter of another embodiment.

Next, a decimation filter of another embodiment in which the octal counter of FIG. 4 is replaced by a ring counter will be explained. FIG. 10 is a block diagram showing the configuration of essential portions of the decimation filter of another embodiment. In the figure, numerals 40 to 46 denote registers with reset function for holding the input signal in accordance with the timing signal CLK, which are reset to 0 when the register signal RESET is activated.

The numeral 47 indicates a register with set function for holding the input signal in accordance with the timing signal CLK, which is set to 1 when the reset signal RESET is activated. An 8-stage ring counter 48 is constituted by connecting these 8 registers 40 to 47 annularly. Control signals CTRLACC0 to CTRLACC7 are outputted directly to the register group 3 from each of the registers 40 to 47.

When the counter configuration is modified as such, the configuration of the control circuit 6 is also modified as follows.

The numeral 65 designates an 8 to 3 encoder which generates 3-bit width count value from the 8 control signals CTRLACC0 to CTRLACC7 from the ring counter 48. The count signals b0 to b2 being outputted are as same as the output signal from the octal counter 4 shown in FIG. 4.

By constructing as aforementioned, the timing of each control system is same as the case wherein two binary counters shown in FIG. 4 are used.

Next, still another embodiment will be explained. FIG. 11 is a block diagram showing the constitution of a decimation filter of still another embodiment. In the embodiment previously described, since intermediate data ACCOUT from the register group 3 are given to the other input terminal of the adder 1, not the product sum operation result ADDOUT but the multiply result data MULOUT was selected by the selector 2 at initialization of the register group 3 by the control signal CTRLTHR, and given to the register group 3. In this embodiment, a value given to the other input terminal of the adder 1 is selected by the selector 2, a zero value is selected at initialization, and the added result of which outputted from the adder 1 and the multiply result data MULOUT is stored in the register group 3. Thus, at initialization of the register group 3, the multiply result data MULOUT is stored in the registers ACC0 30 to ACC7 37 in the same way as the embodiment aforementioned. The other configuration and operation are same as the aforementioned embodiment, that is, a zero value is selected depending upon the active state of the control signal CTRLTHR and the registers ACC0 30 to ACC7 37 selected then are initialized.

Figure 12:
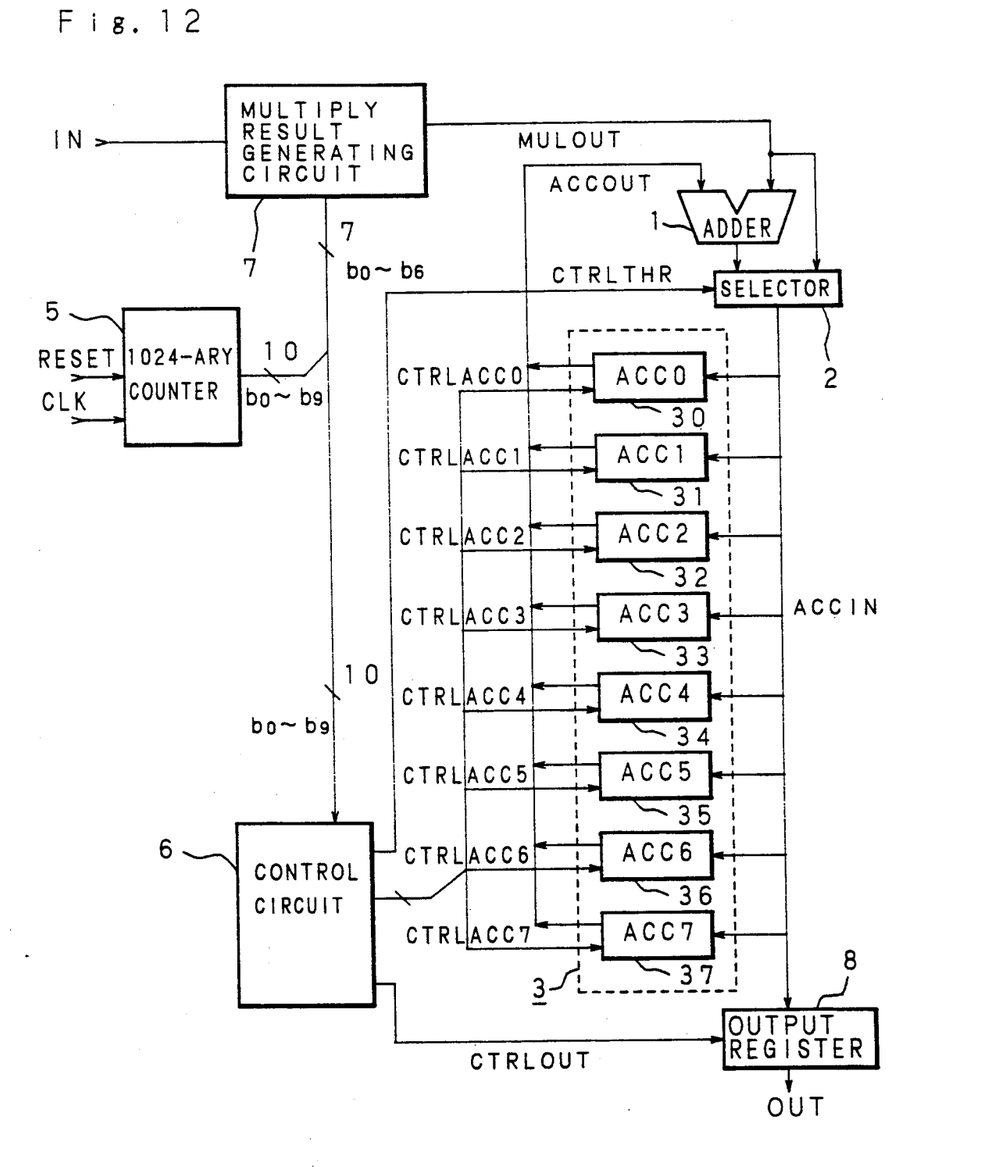
FIG. 12 is a block diagram showing the configuration of a decimation filter of a further embodiment.

Next, a still further embodiment will be described. FIG. 12 is a block diagram showing the configuration of a decimation filter of a still further embodiment. In this embodiment, the octal counter 4 and the 128-ary counter 5 of the first embodiment shown in FIG. 4 are replaced by one 1024-ary counter 9. The other configuration and operation are similar to the first embodiment, so that their explanations will be omitted. In this embodiment, the configuration of the counter is simplified as compared with the first embodiment.

In the above embodiment, though a selector was used as initializing means of the register, and thereby the content of individual registers at the beginning of filtering was initialized, the present invention is not limited thereto, so the initializing means may be those which resets the content of the register directly.

Also, in the above embodiment, though the filtering output data are arranged to be held by the output register, it is to be understood that the present invention is not limited thereto, the content of respective registers may be selected at the output signal period and outputted.

As described heretofore, according to the invention, by providing M numbers of units of storing means which hold not the input signal to be inputted to a digital filter but the output signal for every output period, and by controlling the storing means to output data successively therefrom, product sum operation periods may be effected by M number of times at the input signal period and the operating speed of an arithmetic unit used for the filtering operation may be slowered, thus a low speed arithmetic unit can be employed and the number of registers as the data storing means can be reduced for optimization, which lead to a low power consumption and the simplification of design.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A decimating filter, wherein input signal samples are received at a rate of N number of samples over a predetermined time period, and M number of filter samples are generated in the predetermined time period, wherein each of the M filter samples is a sum of N number of products, each of the products resulting from a multiplication of one of N number of consecutive input signal samples and a corresponding filter coefficient selected from a sequence of N number of filter coefficients, N being a multiple of M greater than M and M being at least two, the decimating filter comprising:

M number of accumulators;

means for resetting each of said M accumulators;

a memory for holding the N filter coefficients at each of N number of memory locations, wherein said memory outputs a filter coefficient at a memory location corresponding to an index value when said index value is applied to an address input of said memory, said index value being characterized as a whole number from zero to N minus one inclusive;

means for receiving an input sample;

a counter, coupled to said means for receiving an input sample, said counter incrementing a count for each input sample input and said counter resetting said count to zero when said count equals N times M;

multiplying means, coupled to said memory and said counter, for calculating M number of products for each input signal sample, wherein each of said M products is a product of said input signal sample and a filter coefficient, said filter coefficient located at a memory location indicated by an index value determined by said count;

adding means, coupled to said multiplying means and said M accumulators, for adding said M products to contents of said M accumulators, wherein one product is added to each accumulator and each product is added to one accumulator;

output means, coupled to said adding means, for outputting contents of a selected one sum of said M sums of N products as a filter sample; and control means, coupled to said means for resetting and coupled to said output means, for triggering said output means to output said selected sum, wherein a sum is selected when said sum is a sum of N products, said sum accumulated in a selected accumulator of said M accumulators, and said control means triggering said resetting means to reset said selected accumulator after said sum is output.

2. The decimating filter of claim 1, wherein said output means is coupled to said M accumulators, and said selected sum is output from a selected accumulator of said M accumulators.

3. The decimating filter of claim 1, wherein said counter is a modulo M times N counter, and wherein said count is incremented by one for each multiplication performed on an input signal sample by said multiplying means, thereby incrementing said count by M for each input sample received.

4. The decimating filter of claim 1, wherein said counter is implemented as a modulo M counter and a modulo N counter, wherein a carry bit of said modulo M counter is applied to a clock input of said modulo N counter.

5. The decimating filter of claim 4, wherein said modulo M counter is implemented as a ring counter and wherein outputs of said ring counter select an accumulator to which a product is to be added.

6. The decimating filter of claim 1, wherein said means for resetting resets an accumulator by loading a product from said multiplying means into said accumulator without adding contents of said accumulator to said product.

* * * * *